(12) United States Patent
Sicard

(10) Patent No.: US 8,750,415 B2
(45) Date of Patent: Jun. 10, 2014

(54) LIN NETWORK, INTEGRATED CIRCUIT AND METHOD THEREFOR

(75) Inventor: Thierry Sicard, Tournefeuille (FR)

(73) Assignee: Freescale Semiconductor, Inc., Austin, TX (US)

(*) Notice: Subject to any disclaimer, the term of this patent is extended or adjusted under 35 U.S.C. 154(b) by 1020 days.

(21) Appl. No.: 12/300,438

(22) PCT Filed: May 24, 2006

(86) PCT No.: PCT/IB2006/052665
§ 371 (c)(1),
(2), (4) Date: Aug. 28, 2009

(87) PCT Pub. No.: WO2007/135491
PCT Pub. Date: Nov. 29, 2007

(65) Prior Publication Data
US 2010/0166085 A1    Jul. 1, 2010

(51) Int. Cl.
*H04B 3/00* (2006.01)
*H04L 25/02* (2006.01)

(52) U.S. Cl.
USPC ............................ 375/297; 375/257; 375/219

(58) Field of Classification Search
USPC .................. 375/256, 219; 327/130; 331/111; 708/852, 36, 37; 340/457.1; 326/27, 326/188
See application file for complete search history.

(56) References Cited

U.S. PATENT DOCUMENTS

| 5,432,817 | A | 7/1995 | Hormel et al. | |
| 6,664,821 | B2* | 12/2003 | De Haas et al. | 327/108 |
| 6,710,617 | B2* | 3/2004 | Humphrey | 326/30 |
| 6,959,014 | B2 | 10/2005 | Pohlmeyer et al. | |
| 7,363,129 | B1* | 4/2008 | Barnicle et al. | 701/29 |
| 2004/0141560 | A1 | 7/2004 | Koyasu | |

FOREIGN PATENT DOCUMENTS

| EP | 1465370 A1 | 10/2004 |
| WO | 02073912 A | 9/2002 |

OTHER PUBLICATIONS

Texas Instruments TPIC1021 LIN Physical Interface; Revised Jul. 2005; http://www.ti.com/lit/ds/symlink/tpic1021.pdf.*
LIN Specification Package Revision 2.0; Sep. 23, 2003; http://www.lin-subbus.org/index.php?pid=8&lang=en&sid=817212d0d0100665ed69522adb57e68f.*
Search Report and Written Opinion in coordinating PCT application No. PCT/IB06/52665 issued Apr. 12, 2007.

* cited by examiner

*Primary Examiner* — Shuwang Liu
*Assistant Examiner* — Ross Varndell

(57) ABSTRACT

A LIN network comprises a transmit driver for communicating on a single communication bus. A slope control module is operably coupled to a supply voltage and arranged to identify a voltage transition, and in response thereto and via control of the transmit driver selectively apply one of: a first voltage transition mode comprising a constant DV/DT slope transition, or a second voltage transition mode comprising a fixed time transition.

20 Claims, 7 Drawing Sheets

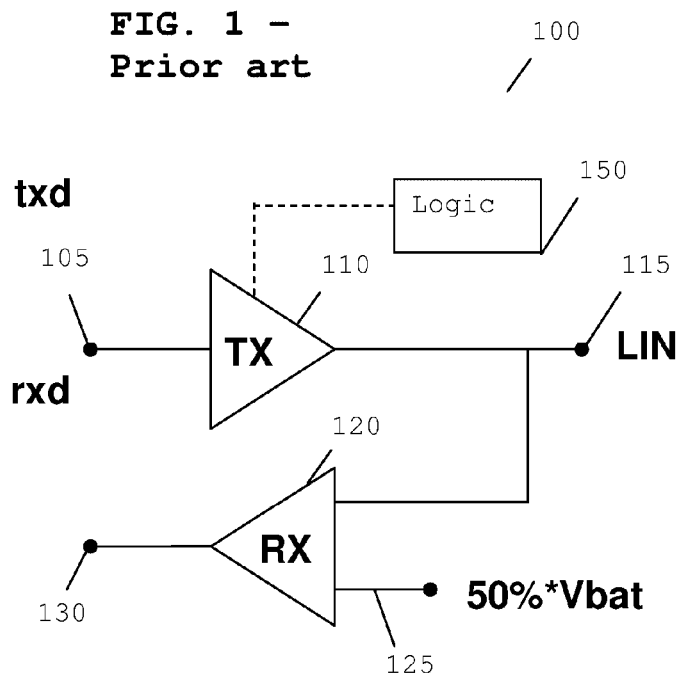
FIG. 1 - Prior art
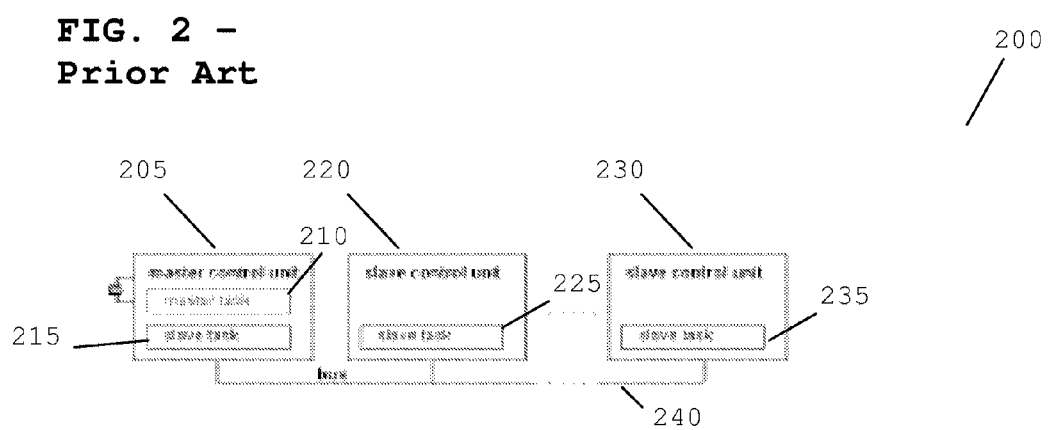
FIG. 2 - Prior Art

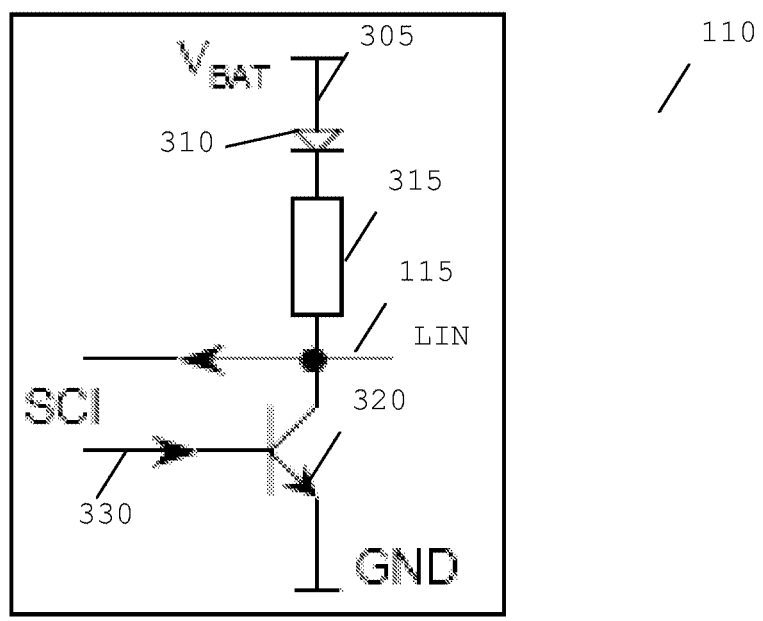
FIG. 3 - Prior Art

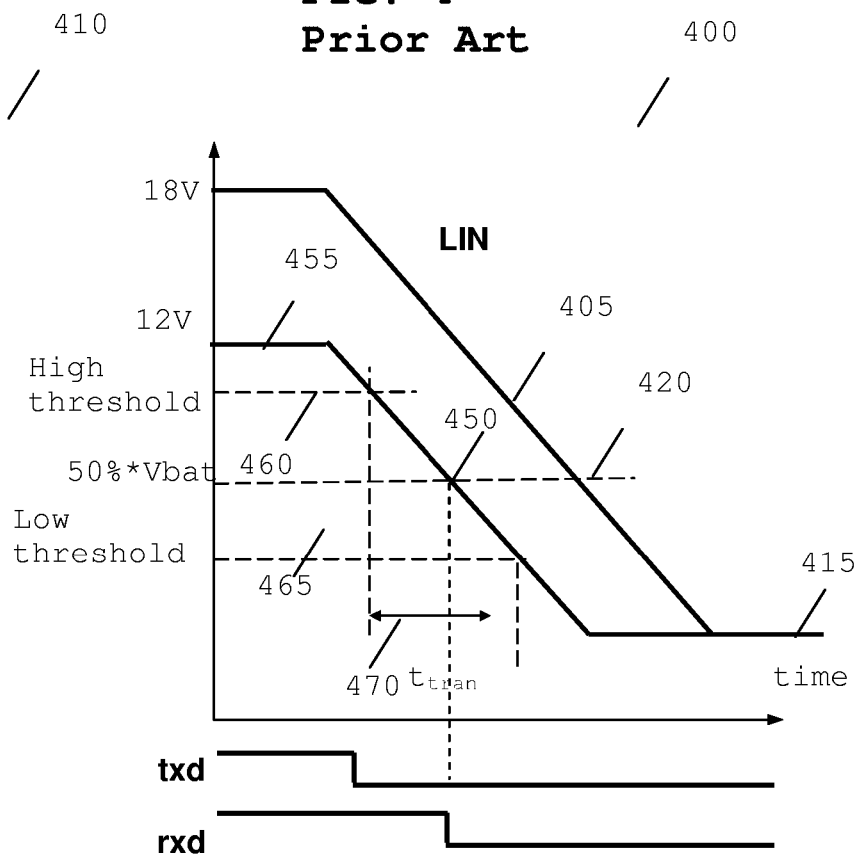
FIG. 4 - Prior Art
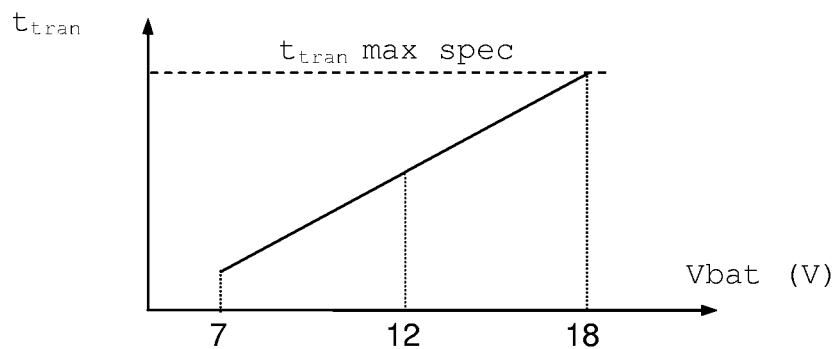

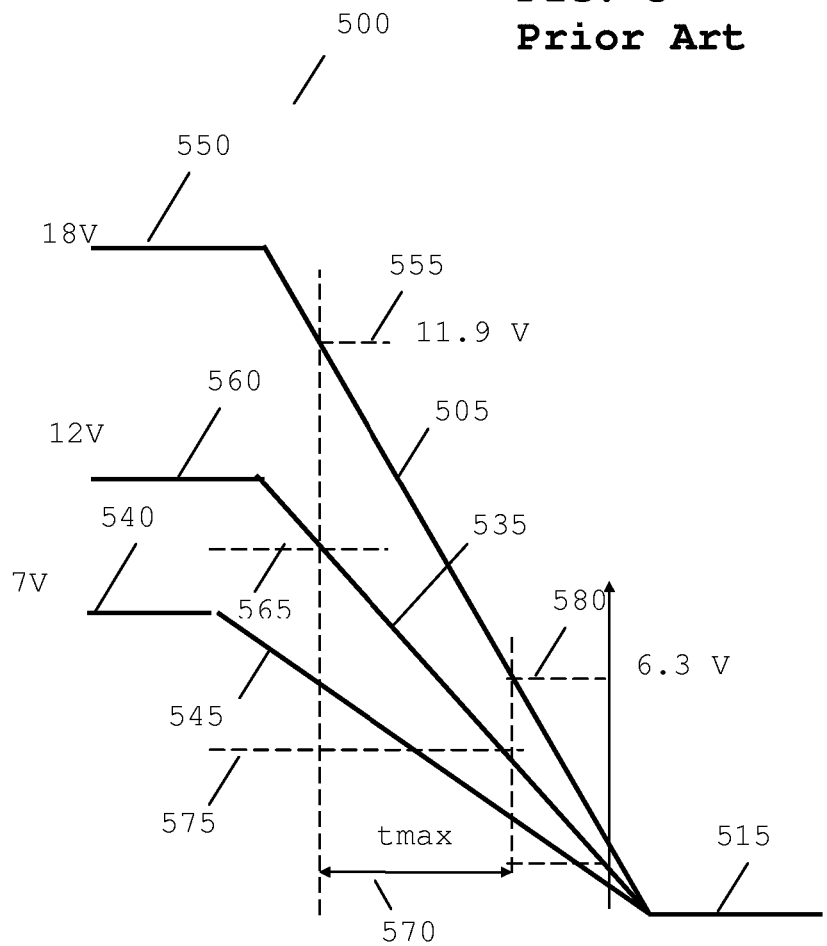
FIG. 5 - Prior Art
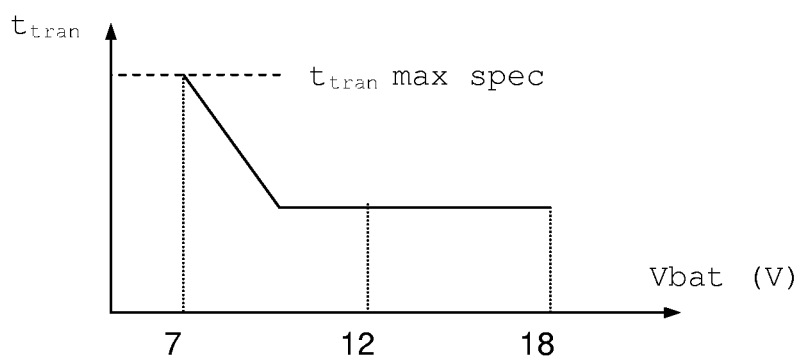

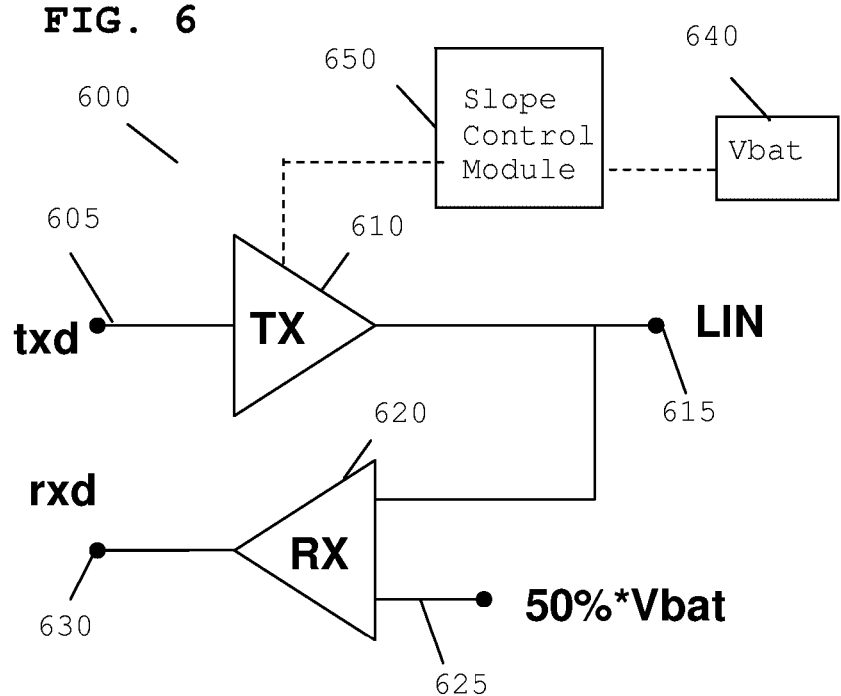

LIN NETWORK, INTEGRATED CIRCUIT AND METHOD THEREFOR

CROSS-REFERENCE TO RELATED APPLICATION

This application claims priority to PCT application PCT/1B06/52665 filed on May 24, 2006.

FIELD OF THE INVENTION

One embodiment of the present invention relates to a single-wire serial communication protocol based on the common serial communication interface (SCI). The invention is applicable to, but not limited to, a mechanism and method to improve electro magnetic susceptibility in a Linear Interconnect Network (LIN).

BACKGROUND OF THE INVENTION

Linear Interconnect Networking (LIN) is an industry standard for a single-wire serial communication protocol, based on the common serial communication interface (SCI) (UART) byte-word interface. UART interfaces are now available as a low cost silicon module and are provided as a feature on the majority of micro-controllers. UART interfaces can take many forms, for example they can be implemented in software or as a state machine interface for application specific integrated circuits (ASICs).

LIN is targeted as an easy to use, open, communication standard, designed to provide more reliable vehicle diagnostics. Access to the communication medium in a LIN network is controlled by a master node, so that no arbitration or collision management software or control is required in the slave nodes, thus providing a guarantee of worst-case latency times for signal transmission.

A node in a LIN network does not make use of any information about the system configuration, except for the denomination of the master node. Nodes can be added to the LIN network without requiring hardware or software changes in other slave nodes. The size of a LIN network is typically under twelve nodes, although the LIN network is not generally restricted to twelve nodes. This results from a use of only '64' identifiers together with a relatively low transmission speed of 20 Kbits/sec. The clock synchronization, the simplicity of UART communication, and the single-wire medium are often cited as major factors for the cost efficiency of LIN.

Referring now to FIG. 1, a simplified LIN node 100 is illustrated. FIG. 1 shows the basic block diagram of the LIN physical layer. A digital input, referred to as txd 105, drives the transmit (Tx) LIN bus driver 110. When the digital input txd 105 is at high logic level, the LIN output, on the single communication line LIN communication bus 115, is at a high level, i.e. the supply voltage of the vehicle battery referred to as $V_{bat}$.

The signal voltage swing on the single communication LIN bus swings from $V_{bat}$ to a low level of approximately 1V. The Tx LIN bus driver 110 is supplied by $V_{bat}$. Each receiver element in a LIN network comprises a comparator 120, which detects when the voltage signal on the single communication LIN bus crosses a value of 50% of $V_{bat}$. The voltage level of the comparator output is therefore controlled by the reference signal 125 input to the comparator 120. When the voltage on the single communication LIN bus is high, i.e. over a level of 50% of $V_{bat}$, the receiver logic (rxd) output 130 is at a high ($V_{bat}$) logic level.

Referring now to FIG. 2, A LIN network 200 is illustrated. The LIN network 200 comprises one master node (control unit) 205 and one or more slave nodes 220, 230. All nodes include a slave communication task 215, 225, 235 that is divided between a transmit task and a receive task. The master node 205 also includes a transmit task 210 and a receive slave task 215. Communication in an active LIN network is performed on the LIN bus 240 and is always initiated by a master task 210.

Referring now to FIG. 3, the simplified circuit of a node is illustrated. FIG. 3 illustrates the output stage of the Tx bus driver 110. The output stage is connected to $V_{bat}$ 305 through a diode 310. A resistive load 315 is used as a pull-up function for the output stage, i.e. the single LIN communication bus 115. A typical value for a resistive load 315 of a slave device is 30 Kohm. Thus, the 30 Kohms pull-up resistor (in series with diode 310 and located inside the IC and identified as mandatory in the LIN specification) is present in each internal LIN node. However, to distinguish the Master node from a slave node a 1 Kohm resistor is placed in series with another diode (not shown), where both the 1 Kohm resistor and diode are located outside of the integrated circuit.

The transistor 320 functions as a switch, through control of the serial communication interface (SCI) 330, and is therefore able to pull-down the single communication LIN bus 115 to a low level.

The LIN specification demands a very low signal perturbation during a communication. For this reason, it is important to optimize transition between high and low voltage levels on the LIN communication bus. In particular, to avoid creating interference on the LIN signal line, the transition between high and low voltage levels must be smooth.

The LIN standard specifies a maximum transition time for the voltage level to travel between high and low voltage levels. As the LIN bus is a single wire communication bus, the single wire acts as an antenna, which generates radio frequency (RF) interference signals. In this regard, in order to limit the RF interference, the known prior art has focused on employing a voltage transition that is a constant $V_{bat}$ versus time ($\Delta V/\Delta T$) relationship 400, as illustrated in FIG. 4.

Referring now to FIG. 4, the constant $V_{bat}$ versus time relationship 400 illustrates two typical high voltage level starting positions, e.g. 18V 410 and 12V 455. Of particular note is that the LIN signal may start from a battery voltage of 18V, through either a voltage surge upon switching on the vehicle engine (and a consequent effect on the 12V battery) or using the LIN system in a heavy goods vehicle that uses an 18V battery.

As illustrated, the corresponding slopes 405, 450 transition the voltage to a low voltage level 415. A maximum transition time $T_{max}$ 470. is specified from an initial voltage drop from a first threshold voltage (thereby providing a sufficient indication that a voltage transition is occurring) to a second threshold voltage 465, which indicates a low voltage level of operation. Notably, as illustrated, when the voltage transition starts from a high voltage level of 18V, there is insufficient time for the voltage to transition below the low threshold voltage 465. As shown, the 18V starting voltage is only unable to drop 420 within the maximum specified time 470, which notably fails to meet the specifications of the LIN standard.

An alternative approach to transitioning between high and low voltage levels has focused on employing a voltage transition that is a fixed time relationship 500, as illustrated in FIG. 5.

Referring now to FIG. 5, the fixed (constant) time relationship 500 illustrates three typical high voltage level starting positions, e.g. 18V 550, 12V 560 and 7V 540. Of particular note is that the fixed time approach employs a transition mechanism that is not reliant upon the starting high voltage level. Again, the LIN signal may start from a battery voltage of 18V, through either a voltage surge upon switching on the engine (and a consequent effect on the battery) or using the LIN system in a heavy goods vehicle that uses an 18V battery. Alternatively, for poor battery conditions, for example due to cold weather, the high voltage level may only be of the order of, say, 7V.

As illustrated, the corresponding slopes 505, 535 and 545 transition the voltage to a low voltage level 515. Again maximum transition time $T_{max}$570 is specified from an initial voltage drop of one-third (thereby providing a sufficient indication that a voltage transition is occurring) to a level below a threshold, which indicates a low voltage level of operation. Notably, with the lower of the high voltage levels as illustrated, a problem occurs due to an effect of a 0.7V drop across a diode (310 in FIG. 3) in the LIN circuitry and any saturation effect in the associated transistors (320).

To explain this effect in greater detail, a LIN driver node has at least one diode (such as diode 315) between the supply voltage (305 in FIG. 3) and the transistor driver (320 of FIG. 3) and often a second diode (not shown) between the transistor driver and ground. In effect, these diodes plus the drop voltage of the switch, forces the LIN amplitude to be less than Vbat. In other terms, due to the voltage drop across the diode(s), the LIN amplitude is not proportional to Vbat (as VLINpp=Vbat−Vdrop where Vdrop is almost a constant voltage due to the diodes and saturation voltage).

Nevertheless, Vdrop has more influence on the non-proportionality when Vbat is low. However, the Tx-Rx threshold is proportional to Vbat. Hence, due to this non-proportionality, the threshold reported to the LIN signal is changing when Vbat decreases. For example, a 40% to 60% ratio of Vbat, when Vbat=6V, will became a 20% to 80% ratio of the LIN signal. This effect increases the Ttran when Vbat is low. Thus, the fixed (constant) time approach is only truly representative of a constant time, and therefore optimum, when variation in Vbat is negligible compared to the diode voltage drop and Vdrop across the switch.

Thus, the known techniques of employing either the fixed time approach to transitioning the voltage or the constant slope (ΔV/ΔT) approach are both problematic for different reasons. Hence, a need exists for an improved LIN network, integrated circuit and method of operation therefor.

SUMMARY OF THE INVENTION

In accordance with aspects of the present invention, there is provided a LIN network, an integrated circuit and method of operation therefor, as defined in the appended Claims.

BRIEF DESCRIPTION OF THE DRAWINGS

FIG. 1 illustrates a known simplified circuit diagram of a LIN node;

FIG. 2 illustrates an overview of a known LIN network;

FIG. 3 illustrates a known transmit driver circuit employed in a LIN network;

FIG. 4 illustrates a known constant ΔV/ΔT voltage level transition mechanism in a LIN system; and FIG. 5 illustrates a known voltage level transition mechanism in a LIN system employing a fixed time approach.

Figure 7:
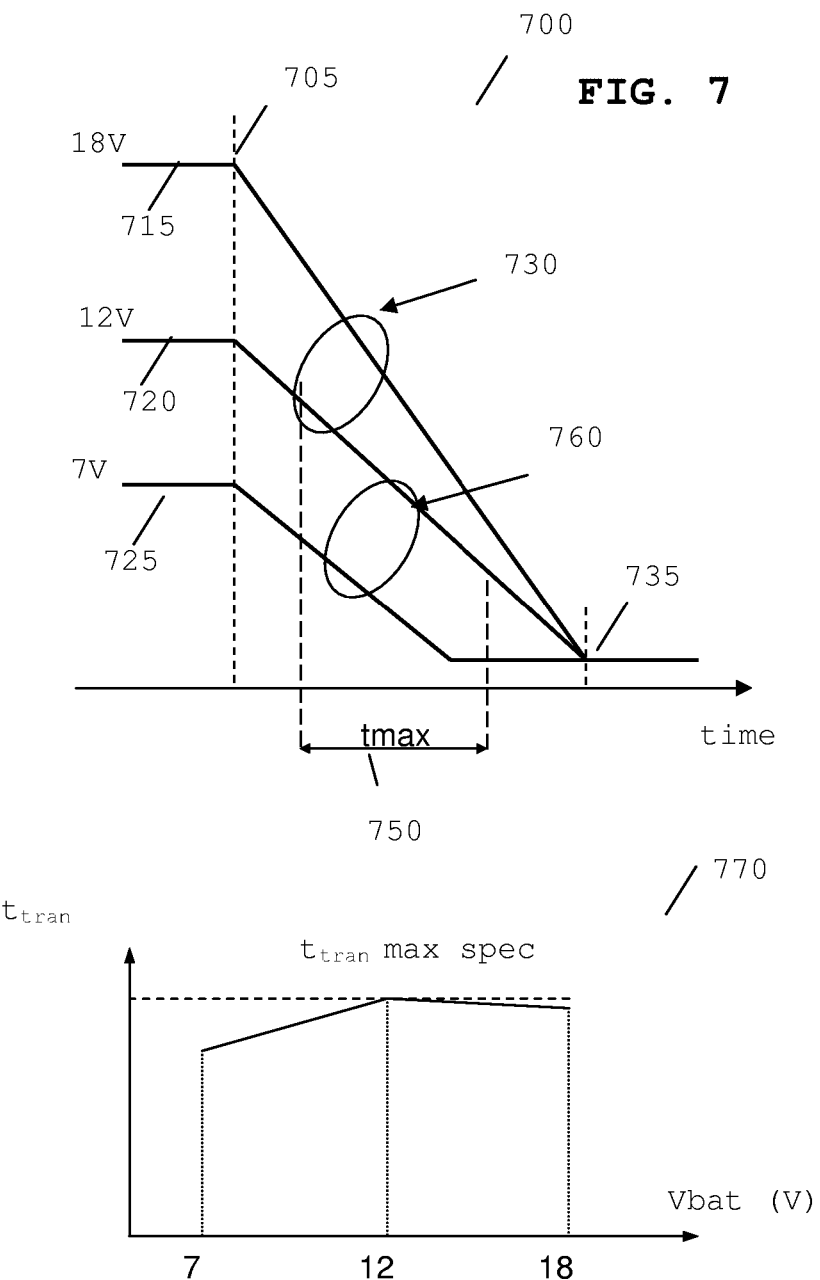
Figure 8:
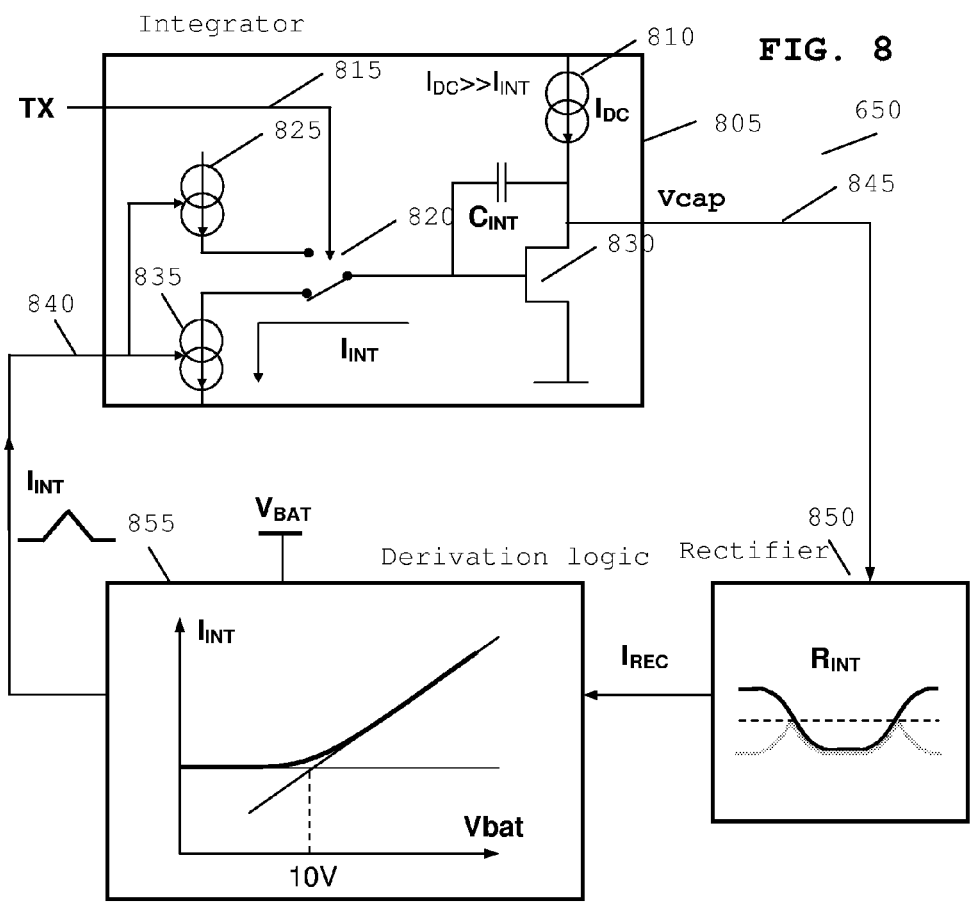

Exemplary embodiments of the present invention will now be described, by way of example only, with reference to the accompanying drawings, in which:

FIG. 6 illustrates a simplified circuit diagram of a LIN node adapted in accordance with embodiments of the present invention;

FIG. 7 illustrates a voltage level transition mechanism employing a selectable constant ΔV/ΔT slope or fixed time approach in accordance with embodiments of the present invention; and FIG. 8 illustrates a slope control module employed in embodiments of the present invention.

DESCRIPTION OF EMBODIMENTS OF THE INVENTION

In one embodiment of the present invention, a Linear Interconnect Networking (LIN) network comprises a transmit driver for communicating on a single communication bus. A slope control module is operably coupled to a supply voltage and arranged to identify a voltage transition thereof, and in response thereto via control of the transmit driver selectively apply one of: a first voltage transition mode comprising a constant DV/DT slope transition, or a second voltage transition mode comprising a fixed time transition.

In this manner, the LIN network provides an improved mechanism to meet the LIN specification. The LIN network may lower EMC emissions during a voltage level transition. The LIN network may allow the system to remain within the system specification for both higher and lower supply voltages (for example battery voltages of between 5V to 18V).

In one embodiment, the slope control module identifies a supply voltage level and a transition therefrom and is arranged to automatically switch from one transition mode to another transition mode in response to said identified voltage level.

In one embodiment, the slope control module selectively applies a first voltage transition mode comprising the constant DV/DT slope transition following a voltage transition indication below a threshold voltage. In one embodiment, the slope control module selectively applies a second voltage transition mode comprising the fixed time transition constant slope for a battery voltage above a threshold voltage. In one embodiment, the threshold voltage may be, say of the order, 12 Volts.+−0.20%.

In a second aspect of the present invention, an integrated circuit for use in a LIN network comprises a transmit driver for communicating on a single communication bus. A slope control module is operably coupled to the transmit driver and a supply voltage arranged to identify a voltage transition of the supply voltage. In response thereto, the logic selectively applies one of: a constant ΔV/ΔT slope transition mode or a fixed time transition mode to transitioning a high voltage level to a low voltage level by control of the transmit driver and/or receive comparator.

In one embodiment, the LIN network may provide improved electro-magnetic compatibility (EMC) performance and simplify integration on the integrated circuit.

In one embodiment, a method of communicating on a single communication bus comprises identifying a voltage transition from a supply voltage level; and in response thereto selectively applying a voltage transition on the single communication bus by either: a first voltage transition mode comprising a constant DV/DT slope transition, or a second voltage transition mode comprising a fixed time transition.

Hereinafter the term 'LIN bus' should be interpreted as meaning any single line communication bus.

Embodiments of the present invention are described with respect to a high-voltage (Tx) to low-voltage (Rx) transition on the LIN bus. However, it is envisaged that the inventive concept described herein is equally applicable to a low-voltage (Rx) to high-voltage (Tx) transition on the LIN bus and that the two transitions should be as symmetrical as possible.

Referring now to FIG. 6, a simplified LIN node 600 of the LIN physical layer is illustrated. A digital input, referred to as txd 605, drives the transmit (Tx) LIN bus driver 610. When the digital input txd 605 is at high logic level, the LIN output, on the single communication LIN bus 615, is at a high level, i.e. the supply voltage of the vehicle battery referred to as $V_{bat}$ 640.

In accordance with embodiments of the present invention, the signal voltage swing on the single communication LIN bus swings between the vehicle battery voltage ($V_{bat}$) 640 and a low voltage level of, say, approximately 1V. In this regard, a slope control module 650 is arranged to identify the battery voltage level in order to identify a LIN voltage transition. In accordance with embodiments of the present invention, and in response thereto slope control module 650 then implements either a constant $\Delta V/\Delta T$ slope transition mode or fixed time transition mode to transition the high voltage level to a low voltage level by appropriate control of the transmit (Tx) LIN bus driver 610 and/or receive (Rx) LIN bus driver 620.

The voltage level transition options are described further in FIG. 7. First, the LIN signal voltage level is determined as being a very high voltage, for example exceeding 12V, such as 18V, 715. In response to this determination, slope control module 650 from FIG. 6, employs a fixed time transition mode 730 to reducing the voltage level in slope. In this manner, the voltage level is reduced to the low voltage level 735 within the maximum time period, $T_{max}$ 750.

In contrast, if the LIN signal voltage level is determined as being at a relatively-low high voltage level, for example below 10V, such as 7V 725. In response to this determination, logic 650 from FIG. 6, employs a constant DV/DT slope transition mode 760 to reducing the voltage level. In this manner, the voltage level is reduced to the low voltage level 735 within the maximum time period, $T_{max}$ 750.

Furthermore, if the voltage level on the LIN communication bus is determined as being at a typical mid-range voltage level, for example around 12V 720, logic 650 from FIG. 6, may employ either a constant DV/DT slope transition mode 760 or a fixed time transition mode 730 to reducing the voltage level. Either way, the voltage level is reduced to the low voltage level 735 within the maximum time period, $T_{max}$ 750.

FIG. 7 further illustrates schematically that the parameter Ttran is optimized for a Vbat of 12V, for example that Ttran is optimum when there is a least amount of radio emission.

In the above embodiments, the voltage level detector 640, together with logic 650, detects whether the voltage level on the single communication LIN bus is above or below a threshold. In one embodiment, the threshold may be around 12 Volts, for example in a range of 12 Volts ±20%.

Referring now to FIG. 8, one example of a slope control module 650 that can be employed in embodiments of the present invention is illustrated. The slope control module 650 comprises an integrator 805 arranged to receive the Tx signal 815. The integrator 805 comprises a transistor 830, which in one embodiment is a field effect transistor (FET), with a source port connected to a current source 810 and a base port connected to a switch 820 under control of a Tx signal 815.

The output 845 of the transistor is applied to a rectifier 850, and the subsequent rectified signal applied to derivation logic 855. The rectifier 850 has a voltage input and a current output (where the current is a derivation of voltage that is proportional (or not) to Vbat according to a mode of operation). The integrator 805 and rectifier provide voltages proportional to an amplitude of Vbat. The curves illustrated in the derivation logic 855 clarify that the current is also proportional to Vbat (in a fixed (constant) time mode) and becomes constant when it is no longer proportional to Vbat (i.e. in a constant slope mode).

The output 840 of the derivation logic 855 is applied to a switch 820, under control of the Tx signal 815 via one of two current source paths 825, 835. In this manner, the integrator 805 is able to reproduces the aforementioned curve to switch from constant time to constant slope.

In the context of the present invention, the expression 'constant slope' encompasses substantially any relationship, including sinusoidal type transitions, whereby for any Vbatt value the slope of the Vlin transition voltage does not change. Such a relationship may encompass discontinuity and should not be construed as being limited to a linear relationship. In other words, 'constant slope' encompasses a slope that does not change, versus time, during a complete transition time, as well as encompassing an average or maximum slope that is constant versus Vbatt, but changes during the transition.

In one embodiment of the invention, the transition between different modes may be performed using analog circuitry (as illustrated in FIG. 8), as compared to digital logic. In this manner, the analog circuitry may be based generally on using a constant (fixed) time mode with a smooth transition to a constant slope mode of operation when $V_{bat}$ goes below 12V.

In this regard, as shown with respect to FIG. 8, the slope of the LIN signal may be generated by the integration of the current in the capacitor (i.e. the slope V/t=I/C). Hence, in this manner, the slope is made proportional to 'I'. If 'I' is proportional to $V_{sup}$, the slope of the LIN signal may be generated to increase with $V_{bat}$. Hence, and advantageously, as the slope of the LIN signal is proportional to $V_{bat}$, the analog circuitry operates in a fixed (constant) time mode. The analog circuitry may be a controlled loop with low gain, and arranged to force the current of the LIN signal to be constant when the current reaches the threshold $I_{const}$. As the loop is arranged with a low gain, the current is able to smoothly transition from being proportional 'I' to a fixed/constant time mode.

Thus, embodiments of the present invention enable a reduction in the electromagnetic emission interference (EMI), and maintaining voltage transitions between a high and low voltage levels within the LIN standard by providing a mechanism that is able to select either a constant $\Delta V/\Delta T$ slope transition mode or a fixed time transition mode.

It will be understood that the improved LIN network and method of operation therefor, as described above, aims to provide at least one or more of the following advantages:
  (i) The voltage transition time is arranged to meet the LIN standard, irrespective of the battery voltage at a particular level prior to transition.
  (ii) The desired voltage transition time is met using a mechanism that ensures low EMC emissions.
  (iii) The aforementioned mechanism can be applied to any supply voltage range.
  (iv) The improved EMC performance simplifies integration at an integrated circuit (IC) level.

In particular, it is envisaged that the aforementioned inventive concept can be applied by a semiconductor manufacturer to any single communication line circuit. It is further envisaged that, for example, a semiconductor manufacturer may employ the inventive concept in a design of a stand-alone device, such as a LIN driver, or application-specific integrated circuit (ASIC) and/or any other sub-system element.

It will be appreciated that any suitable distribution of functionality between different functional units may be used without detracting from the inventive concept herein described.

Hence, references to specific functional devices or elements are only to be seen as references to suitable means for providing the described functionality, rather than indicative of a strict logical or physical structure or organization.

Aspects of the invention may be implemented in any suitable form including hardware, software, firmware or any combination of these. The elements and components of an embodiment of the invention may be physically, functionally and logically implemented in any suitable way. Indeed, the functionality may be implemented in a single unit or IC, in a plurality of units or ICs or as part of other functional units.

In particular, it is envisaged that the aforementioned inventive concept can be applied by a semiconductor manufacturer to any integrated circuit capable of operating in a single communication bus. It is further envisaged that, for example, a semiconductor manufacturer may employ the inventive concept in a design of a stand-alone device or application-specific integrated circuit (ASIC) and/or any other sub-system element.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to "a", "an", "first", "second" etc. do not preclude a plurality.

Thus, an improved LIN network, integrated circuit and method of operation therefor have been described, wherein the aforementioned disadvantages with prior art arrangements have been substantially alleviated.

The invention claimed is:

1. A Linear Interconnect Network (LIN) network comprising:
    a transmit driver for communicating on a single communication bus; and
    a slope control module operably coupled to a supply voltage and arranged to compare a supply voltage level provided to the slope control module by the supply voltage to a threshold voltage level, and in response thereto and via control of the transmit driver selectively apply:
        a first voltage transition mode comprising a fixed DV/DT slope transition in response to the supply voltage level being below the threshold voltage level, wherein the fixed DV/DT slope transition is not based on the supply voltage level, wherein a slope of the fixed DV/DT slope transition is the same for different supply voltage levels that are below the threshold voltage level in response to the fixed DV/DT slope transition; and
        a second voltage transition mode comprising a fixed time transition in response to the supply voltage level being greater than the threshold voltage level, wherein a slope of the second voltage transition mode is based on the supply voltage level, wherein the slope transition is greater for higher supply voltage levels than lower supply voltage levels above the threshold voltage level in response to the fixed time transition.

2. The LIN network of claim 1 wherein the slope control module automatically switches from one transition mode to another transition mode in response to the supply voltage level.

3. The LIN network of claim 1 wherein the threshold voltage is in a range of 12 Volts+20%.

4. The LIN network of claim 1 wherein the supply voltage level is provided as an output on the single communication bus.

5. The LIN network of claim 1 wherein the high voltage level is approximately the supply voltage level.

6. The LIN network of claim 1 wherein the low voltage level is approximately 1V.

7. The LIN network of claim 1 wherein the slope control module is further configured to selectively apply either the first voltage transition mode or the second voltage transition mode in response to the supply voltage level being substantially equal to the threshold voltage level.

8. An integrated circuit for use in a Linear Interconnect Network (LIN) network comprising:
    a transmit driver for communicating on a single communication bus; and
    a slope control module operably coupled to a supply voltage and arranged to compare a supply voltage level provided from the supply voltage to a threshold voltage level, and in response thereto selectively apply:
        a fixed $\Delta V/\Delta T$ slope transition mode in response to the supply voltage level being less than the threshold voltage level, wherein the fixed $\Delta V/\Delta T$ slope is not based on the supply voltage level, wherein the fixed $\Delta V/\Delta T$ slope transition is the same for different supply voltage levels that are below the threshold voltage level in response to the fixed $\Delta V/\Delta T$ slope transition; and
        a fixed time transition mode to transitioning between a high voltage level and a low voltage level in response to the supply voltage level being greater than the threshold voltage level, wherein a slope of the fixed time transition mode is based on the supply voltage level, wherein the slope transition is greater for higher supply voltage levels than lower supply voltage levels above the threshold voltage level in response to the fixed time transition.

9. The integrated circuit of claim 8 wherein the slope control module identifies a detected voltage level and a transition therefrom and is arranged to automatically switch from one transition mode to another transition mode in response to the detected supply voltage level.

10. The integrated circuit of claim 8 wherein the threshold voltage is in a range of 12 Volts+20%.

11. The integrated circuit of claim 8 wherein the supply voltage level is provided as an output on the single communication bus.

12. The integrated circuit of claim 8 wherein the high voltage level is approximately the supply voltage level.

13. The integrated circuit of claim 8 wherein the slope control module is further configured to selectively apply either the first voltage transition mode or the second voltage transition mode in response to the supply voltage level being substantially equal to the threshold voltage level.

14. A method of communicating on a Linear Interconnect Network (LIN) network on a single communication bus, the method comprising:
  comparing a supply voltage level from a supply voltage to a threshold voltage level; and
  in response thereto selectively applying a voltage transition on the single communication bus, by:
    a first voltage transition mode comprising a fixed DV/DT slope transition in response to the supply voltage level being below the threshold voltage level, wherein the fixed DV/DT slope is not based on the supply voltage level, wherein the fixed DV/DT slope transition is the same for different supply voltage levels that are below the threshold voltage level in response to the fixed DV/DT slope transition; and
    a second voltage transition mode comprising a fixed time transition in response to the supply voltage level being greater a threshold voltage level, wherein a slope of the second voltage transition mode is based on the supply voltage level, wherein the slope transition is greater for higher supply voltage levels than lower supply voltage levels above the threshold voltage level in response to the fixed time transition.

15. The method of claim 14 wherein automatically switching from one transition mode to another transition mode in response to a detected supply voltage level.

16. The method of claim 14 wherein the threshold voltage is in a range of 12 Volts+20%.

17. The method of claim 15 wherein the threshold voltage is in a range of 12 Volts+20%.

18. The method of claim 14 wherein the supply voltage level is provided as an output on the single communication bus.

19. The method of claim 14 wherein the high voltage level is approximately the supply voltage level.

20. The method of claim 14 further comprising:
  selectively applying either the first voltage transition mode or the second voltage transition mode in response to the supply voltage level being substantially equal to the threshold voltage level.

* * * * *